United States Patent [19]

Tokuda

[11] Patent Number: 5,363,172
[45] Date of Patent: Nov. 8, 1994

[54] METHOD OF PROJECTION EXPOSURE AND STEPPER

[75] Inventor: Noriaki Tokuda, Kawasaki, Japan

[73] Assignee: Nikon Corporation, Tokyo, Japan

[21] Appl. No.: 16,086

[22] Filed: Feb. 10, 1993

[30] Foreign Application Priority Data

Feb. 19, 1992 [JP] Japan .................................. 4-031993

[51] Int. Cl.[5] .............................................. G03B 27/72
[52] U.S. Cl. .................................................... 355/71
[58] Field of Search ........................................ 355/71

[56] References Cited

U.S. PATENT DOCUMENTS

| 4,685,777 | 8/1987 | Hirose | 350/505 |
| 4,931,830 | 6/1990 | Suwa et al. | 355/71 |

Primary Examiner—Michael L. Gellner
Assistant Examiner—D. P. Malley
Attorney, Agent, or Firm—Shapiro and Shapiro

[57] ABSTRACT

A stepper is provided with an optical illumination system and an optical projection system having variable stops, respectively. Such a stepper is capable of preventing the harmful effects which are produced by the operation to be executed in a state where the direct rays passing the variable stop on the optical illumination system side irradiate the variable stop on the optical projection system side when the aperture numbers are set by the variable stops, respectively. For the stepper which is provided with an illuminating system to illuminate a reticle, an optical projection system to image the projected image of the reticle on a transferring substrate, a first variable stop device to make variable the aperture number of an irradiation light converging optical system for the reticle, which is arranged in the illumination system, and a second variable stop device to make variable the aperture number of the optical system arranged in the optical projection system, there is provided a control device to cause the exposure operation to be disabled except when the aperture numbers each set by the first and second variable stop devices allow all of the zero order diffraction rays passing the first variable stop device to pass the aperture of the second variable stop device.

13 Claims, 7 Drawing Sheets

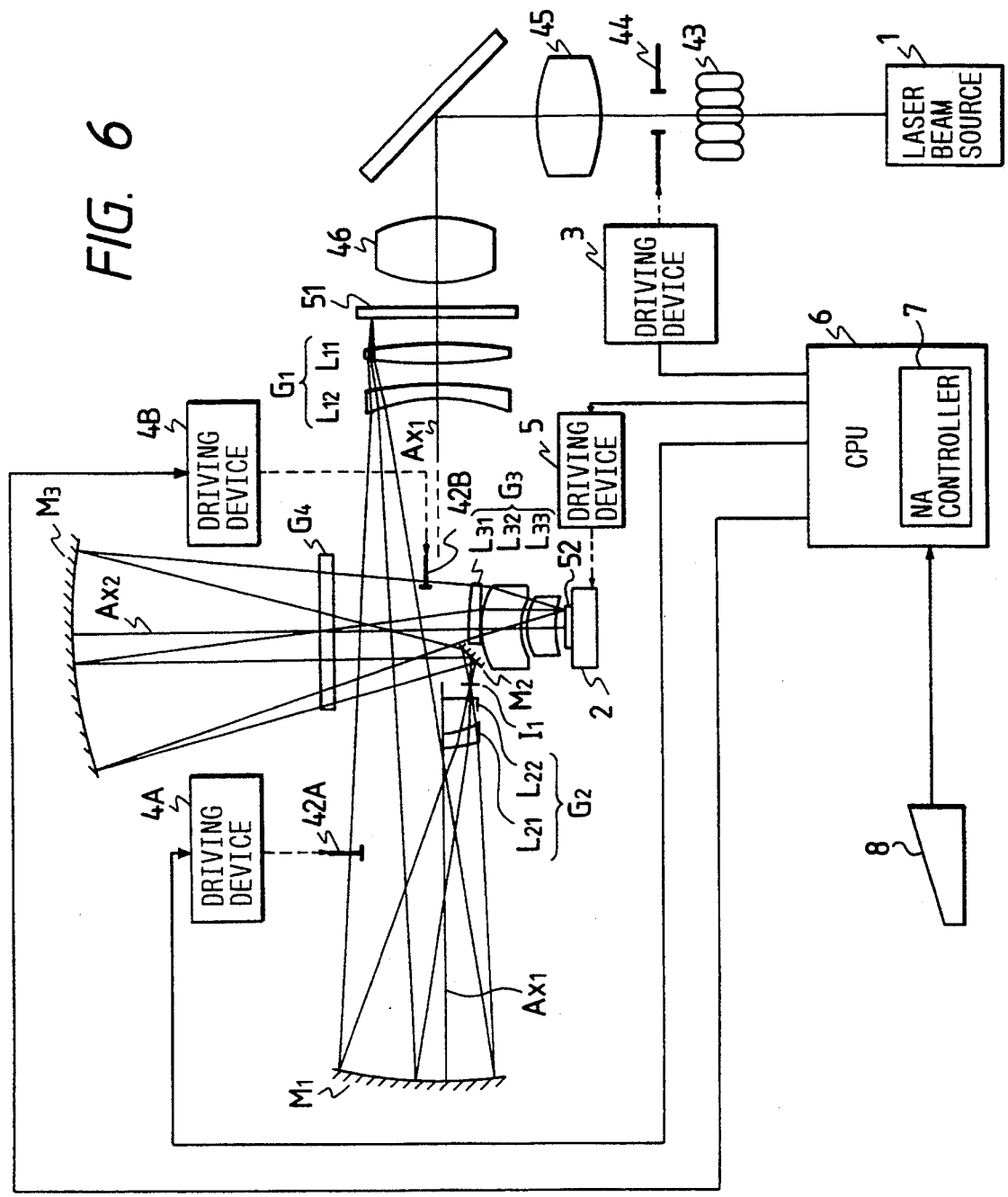

METHOD OF PROJECTION EXPOSURE AND STEPPER

BACKGROUND OF THE INVENTION

1. Field of the Invention

The present invention relates to a stepper used for the fabrication of semiconductor elements and liquid crystal devices. More particularly, the invention relates to the improvement of the optical systems therefor.

2. Related Background Art

In a projection type aligner which is known as a stepper, an illuminating light is irradiated onto a reticle or the original of a mask and others (hereinafter, referred simply to as reticle) on which a pattern is formed for the formation of a given circuit, and the projected image of the pattern is transferred by exposure to a photoresist-coated substrate (a wafer, for example). In recent years, the pattern dimensions of the semiconductor elements have increasingly become minuter with higher densities. As a result, severer demands are imposed upon the optical conditions such as the focal depth, resolution, and transfer precision, or exposure transfer conditions.

Also, due to the production of a small quantity for a variety of different products brought about by the subdivision of functions and others of semiconductor elements, different patterns are exposed on the respective chips on one and the same wafer in some cases. In such cases, it is necessary to replace reticles while the alignment is in operation continuously. Also, along with the circuits becoming more complicated, the alignment operation should be repeated in each of the multiple layers. In such a case, the alignment patterns differ from each other for the respective layers. Each time such a different pattern is used, the severe demands on the optical conditions and others as described above must be met.

In order to meet a demand of this kind, a stepper is designed in such a manner that a variable aperture stop is provided for the pupil plane of each of the optical illumination system for converging the illuminating rays onto the reticle to irradiate it and the optical projection system to image the projected image of the reticle on the wafer, and that the aperture numbers of the optical illumination system and optical projection system are set at the optimal values to satisfy the foregoing demands by adjusting the stops to provide the appropriate amounts, respectively.

FIG. 8 is a view schematically showing the structure of a stepper provided with a prior art variable stop mechanism such as described above.

The illuminating rays from a light source (not shown) are appropriately formed and transmitted through a flyeye lens 43 as parallel beams; thus allowing the illuminating rays to be uniform. The light beams are further converged through a field lens 45 and a condenser lens 46 to irradiate with the uniform illuminance distribution the reticle 51 on which the original patterns are represented. The projected pattern image of the reticle 51 is imaged on the wafer 52 by the optical projection system 41 comprising a projection lens and others.

At the exit of the flyeye lens 43, a first variable stop (aperture stop) 44 capable of adjusting the size of the aperture as indicated by an arrow D is arranged to set the aperture number (NAi) of the optical illumination system at an appropriate value. Also, on the pupil plane positioned in the optical projection system 41, there is arranged a second variable stop (aperture stop) 42 capable of adjusting the size of the aperture as indicated by an arrow E to set the aperture number (NAp) of the optical projection system 41 at an appropriate value.

Here, the aperture number NAi of the optical illumination system is given as $NAi = \sin \theta_I$. Also, the aperture number NAp of the optical projection system 41 is given as $NAp = \sin \theta_W$. In other words, with the adjustment of the first variable stop 44, the opening angle for the illuminating beams to the reticle 51 is moderately adjusted; hence enabling an aperture number to be set desirably for the optical illumination system. Also, with the adjustment of the second variable stop 42, the aperture angle $(= 2\theta_W)$ of the projecting alignment beams is moderately adjusted for the wafer 52; hence enabling the aperture number to be set desirably for the optical projection system.

On the other hand, as important factors to satisfy the required optical conditions of exposure, there are the resolving power R and the focal depth DOF as indices on resolution. These are expressed as $R = k_1 \times \lambda / NAp$ and $DOF = k_2 \times \lambda / (2 NAp^2)$, respectively. The $k_1$ and $k_2$ are constant, and the $\lambda$ is the wavelength of the illuminating light for exposure. The $\lambda$ is set constantly by the illuminating light to be employed. Therefore, in order to enhance the resolution (to make the R smaller), it is desirable to use a laser light or others having a short wavelength, at the same time making the aperture number NAp great. However, if the aperture number NAp becomes greater, the focal depth DOF becomes smaller varying inversely as the square. Hence, a problem is encountered among others that it is difficult to perform the positional adjustment between the exposing surface and the imaging plane on a wafer. On the contrary, if the aperture number NAp 6 made smaller in order to provide a greater focal depth, the value R becomes greater to lower the resolution (resolving power). Therefore, when considering the aperture number for each of the optical systems in an aligner before the execution of the pattern exposure, the requirements of the resolution and focal depth should be considered per pattern. Furthermore, various exposure conditions, and the conditions of reticle, wafer, and others should be considered in accordance with the pattern in this case so as to set an optimal value for the combination of the aperture numbers NAi and NAp of the foregoing optical illumination system and optical projection system.

FIG. 7 is a plane view illustrating the stop aperture plane to explain the distribution of the direct rays of light (zero order diffraction light) from the flyeye lens 43 of the optical illumination system arranged for the pupil plane of the foregoing optical projection system 41, namely, the plane where the variable stop 42 is installed. An inner circle 11 indicated by a dashed line represents the aperture inner periphery of a first variable stop 44 while an outer circle 12 indicated by a solid line represents the aperture inner periphery of a second variable stop 42. In the aperture periphery 11 of the first variable stop, each of the flyeye images 13 of the flyeye lens 43 is evenly distributed all over, respectively. This inner circle 11 can be expanded or contracted within a range indicated by an arrow A by increasing or decreasing the stop aperture of the first variable stop 44. Also, the outer circle 12 can be expanded or contracted within a range indicated by an arrow B by increasing or decreasing the stop aperture of the second variable stop 42.

Usually, the circle 11 of the first variable stop is set inside from the circle 12 of the second variable stop to make its δ value approximately 0.5 to 0.7. In other words, the stop down amount of each of the variable stops is adjusted to set the aperture numbers of the optical illumination system and optical projection system so that the direct rays of light (zero order diffraction light) transmitted through the reticle 51 of the illuminating light from the flyeye lens 43 (second light source) which has passed the first variable stop 44 can all be passed through the aperture of the second variable stop 42. Here, the value δ is expressed as $\delta = NA_i \times \alpha / NA_p$ where the α is the magnification of the projection exposure. In FIG. 7, it can be regarded as indicating a ratio of the image size of the stop aperture (circle 11) of the optical illumination system to the aperture (circle 12) of the optical projection system.

As describe earlier, however, if the optimal aperture numbers are individually set by the respective adjustment of the variable stops 44 and 42 each for the optical illumination system and optical projection system in accordance to each of the exposure patterns, the movable ranges A and B of the stops are overlapped in a range indicated by arrows C. Therefore, in some cases, the circle 11 of the stop on the optical illumination system side may be set larger than the circle 12 of the stop on the optical projection system side inevitably. This condition can be expressed by the following formula using the foregoing aperture numbers:

$$NA_p < NA_i \times \alpha$$

In such a state as this, a part of the beams adjusted by the stop down of the first variable stop 44 is shielded by the second variable stop 42. Therefore, not only is this unacceptable optically, but also, problems will be encountered as set forth below. In other words, whereas each blade of the stop is provided with a reflection preventive coating, the rays of light reaching the second variable stop 42 are partly reflected to scatter; thus producing a flare to cause the exposure performance and quality to be degraded. Particularly, when a laser of a far ultraviolet wavelength band, such as an excimer laser is used for an exposure light source, the coating of the blade surface is deteriorated to bring about the peeling and sublimation of coating, and other chemical changes because the direct light having a highly densified energy is converged onto the stop blade surface. Thus, the coating agent adheres to the other optical members to produce an adverse effect on the functions of such members, and other harmful effects.

SUMMARY OF THE INVENTION

The present invention is designed in consideration of the above-mentioned drawbacks of the prior art is an object of the present invention to provide a method of projection exposure and a stepper capable of preventing any harmful effects that may be produced when exposures are conducted in such a state that the direct rays of light passing a variable stop on an optical illumination system side beat down upon a variable stop on an optical projection system side, in a case where an optimal aperture number is provided for each of the optical systems by each of the variable stops, in accordance with the exposure patterns (reticle pattern and the like) in a stepper provided with the variable aperture stops independently operative for the optical illumination system and optical projection system, respectively.

In order to achieve the above-mentioned object, the projection exposure method according to the present invention is a method wherein a reticle with transferrable patterns being formed thereon is caused to image the projected image of such reticle on a transcribing substrate through an optical projection system, and whether all the zero order diffraction light passing the reticle among the illuminating rays of light having passed a first variable stop arranged in an optical illumination system can be transmitted through an aperture of a second variable stop or not is determined by the aperture number of the optical illumination system and the aperture number of the optical projection system; hence disabling the exposure operation if it is determined that a part or all of the foregoing zero order diffraction light cannot pass the aperture of the foregoing second variable stop.

Also, in order to achieve the above-mentioned object, a stepper according to the present invention is an apparatus wherein a reticle with transferable patterns being formed thereon is caused to image the projected image of such reticle on a transcribing substrate through an optical projection system, and such a stepper is provided with controlling means to determine whether all the zero order diffraction light passing the reticle among the illuminating rays of light having passed a first variable stop arranged in an optical illumination system can be transmitted through an aperture of a second variable stop or not, by the aperture number of the optical illumination system and the aperture number of the optical projection system, and disable the exposure operation if it is determined that a part or all of the foregoing zero order diffraction light cannot pass the aperture of the foregoing second variable stop.

According to the method of the projection exposure of the present invention, the next process in an exposure operation is disabled unless the relationship between the aperture number of the optical illumination system and the aperture number of the optical projection system becomes such a relationship that all the direct light (the zero order diffraction light passing the reticle) having passed the first variable stop aperture can be allowed to pass the second variable stop aperture. Accordingly, there is no possibility that the exposure light can be irradiated directly onto the blades of the second variable stop arranged in the optical projection system; thus making it possible to prevent any harmful effects such as the lowered exposure performance due to flare and others, the deterioration of the coating agent on the blades, and the adhesion of the coating agent to the optical components due to its peeling.

Also, according to a stepper of the present invention, it is possible to implement the above-mentioned method of projection exposure as it is.

BRIEF DESCRIPTION OF THE DRAWINGS

FIG. 6 is a view schematically showing the structure of a stepper according to a third embodiment of the present invention.

DETAILED DESCRIPTION OF THE PREFERRED EMBODIMENTS

Figure 1:
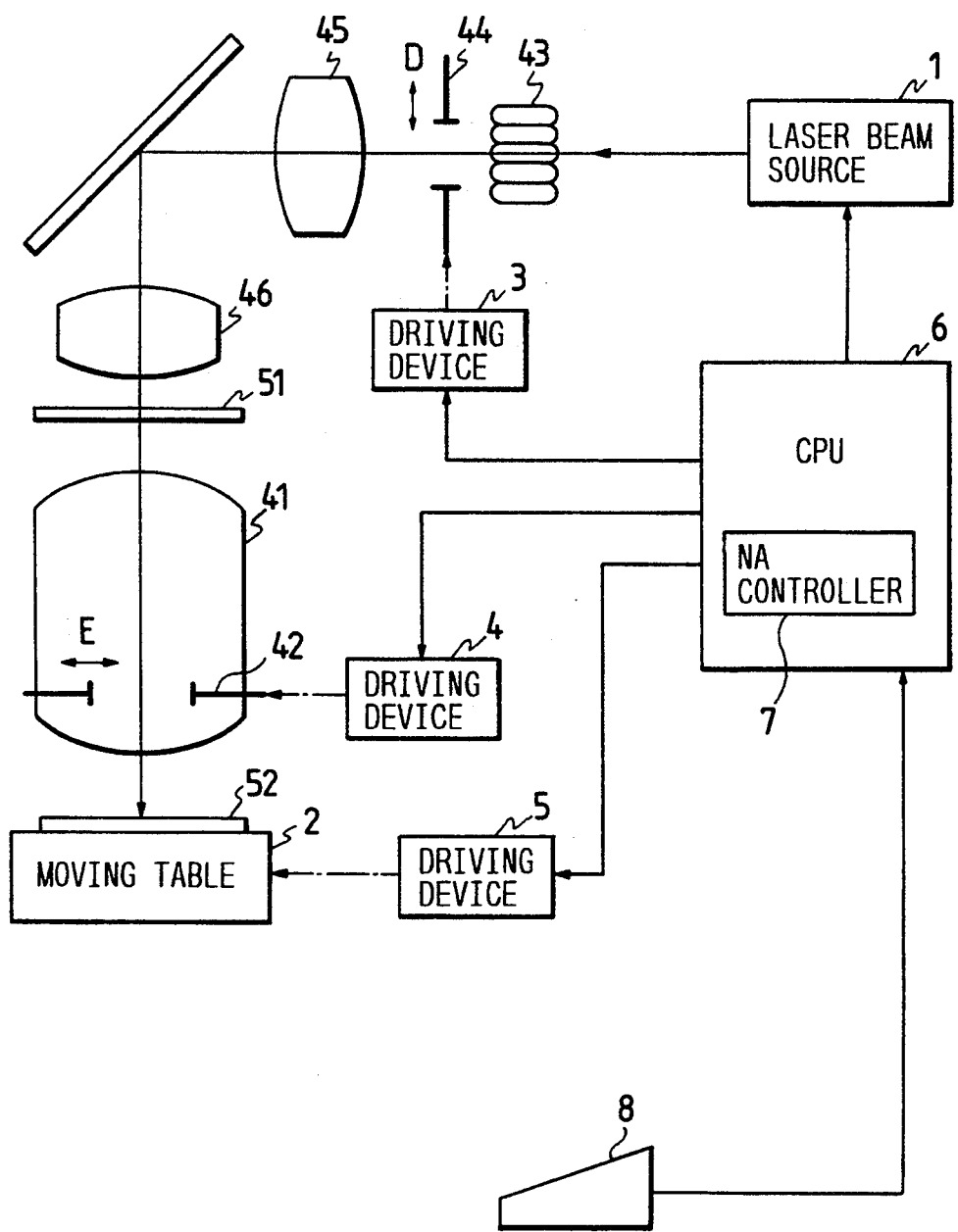
FIG. 1 is a view schematically showing the structure of a stepper according to a first embodiment of the present invention.

FIG. 1 is a view schematically showing the structure of a stepper according to a first embodiment of the present invention.

The illuminating rays of light from a laser beam source 1 are appropriately formed to pass a flyeye lens 43 as parallel beams. Thus, the illuminating rays of light are made uniform. The beams are further converged through a field lens 45 and a condenser lens 46 to irradiate the reticle 51 on which the original patterns are represented. The projected images of the patterns on this reticle 51 are imaged on a wafer 52 by an optical projection system 41 comprising a projection lens and others. The wafer 52 is fixedly mounted on a movable table 2 which can be moved within the XY plane, moved vertically along the axis Z perpendicular to the XY plane, and minutely rotated around the axis Z.

At the exit of the flyeye lens 43, a first variable stop (aperture stop) 44 capable of moderately adjusting the size of the aperture as indicated by an arrow D is arranged to set the aperture number (NAi) of the optical illumination system (comprising the flyeye lens 43, field lens 45, condenser lens 46, and a reflective mirror according to an example shown in FIG. 1) at an appropriate value. Also, at the pupil plane positioned in the optical projection system 41, a second variable stop (aperture stop) 42 capable of moderately adjusting the size of the aperture as shown in an arrow E is arranged to set the aperture number (NAp) at an appropriate value. In this respect, the expanding angle of the beams illuminating the reticle 51 is controlled by the aperture number set by a variable mechanism such as NAi (first stop 44). Also, of the diffraction light emitted from the reticle 51, the order of the diffraction light which is allowed to pass the projection lens 41 is controlled by the aperture number set by a variable mechanism such as NAp (second stop 42).

The first and second variable stops 44 and 42 are respectively connected to driving devices 3 and 4 each comprising a motor and others to vary the stop amounts. Also, a movable table 2 with a wafer 52 mounted thereon is connected to a driving device 5 comprising X and Y direction driving motors, a Z axis vertical direction driving motor, a Z axis rotation driving motor, and others to perform the exposure position adjustments.

Each of the driving devices 3, 4, and 5 is connected to a CPU 6 which executes the driving control thereof. In accordance with a given program, the CPU 6 performs the sequential controls on the reception, transportation, and positioning of the reticle and wafer, and the setting and exposure operations of optical systems in response to the various exposure conditions among others. This CPU 6 is provided with aperture number controlling means 7 having a program which determines whether the aperture numbers of the optical illumination system and optical projection system given by the foregoing first and second variable stops 44 and 42 hold a predetermined relationship or not, and if negative, the exposure operation will be disabled. The various exposure conditions including the setting values for the aperture numbers of the first and second variable stops 44 and 42 are inputted into the CPU 6 through a key board 8.

Figure 2:
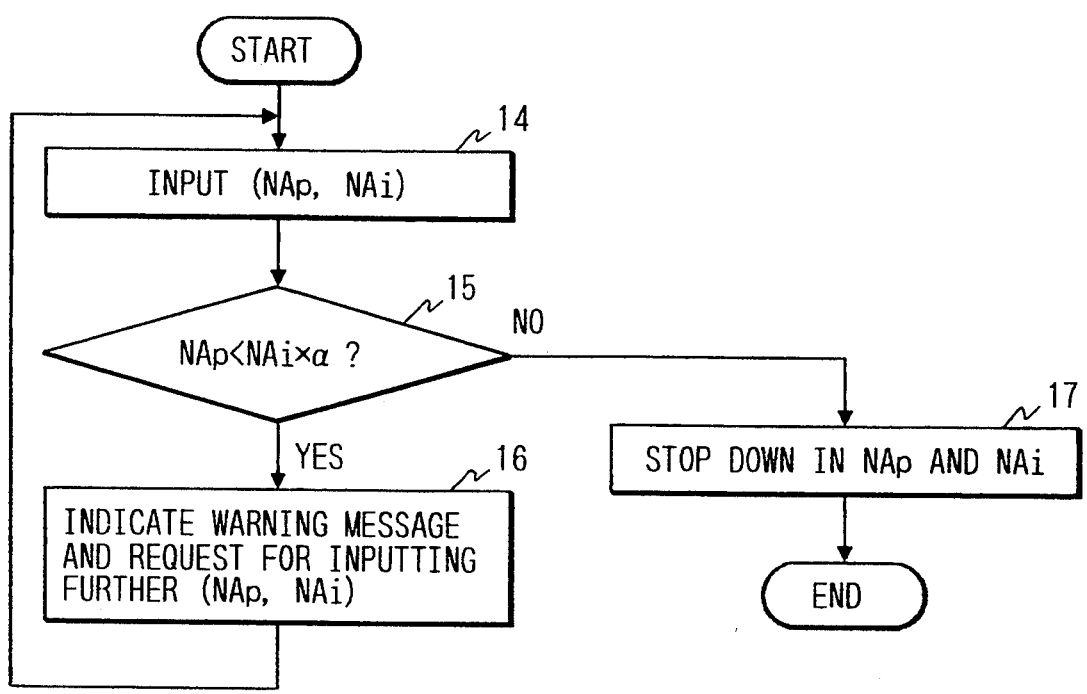
FIG. 2 is a flowchart showing the aperture number setting up sequence for the stepper shown in FIG. 1.

FIG. 2 is a flowchart showing the aperture number setting sequence to set up the aperture numbers NAi and NAp of the optical illumination system and optical projection system by driving the first and second variable stops 44 and 42, respectively.

Figure 7:
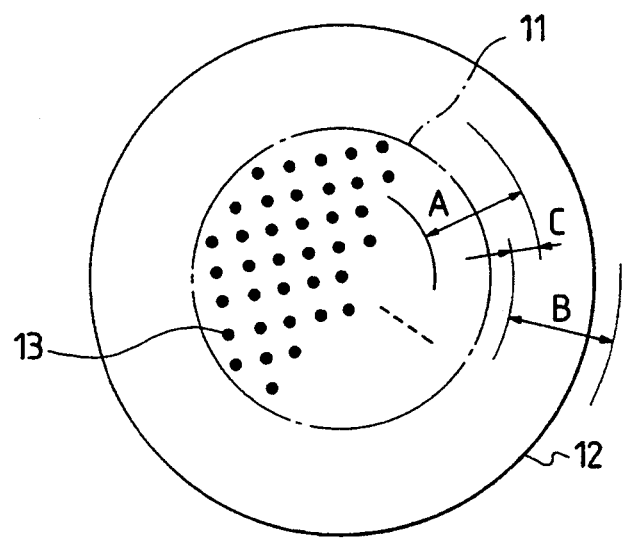
FIG. 7 is a view illustrating the relationship between the image of the variable stop aperture on an optical illumination system side and the image of the variable stop aperture on an optical projection system side.
Figure 8:
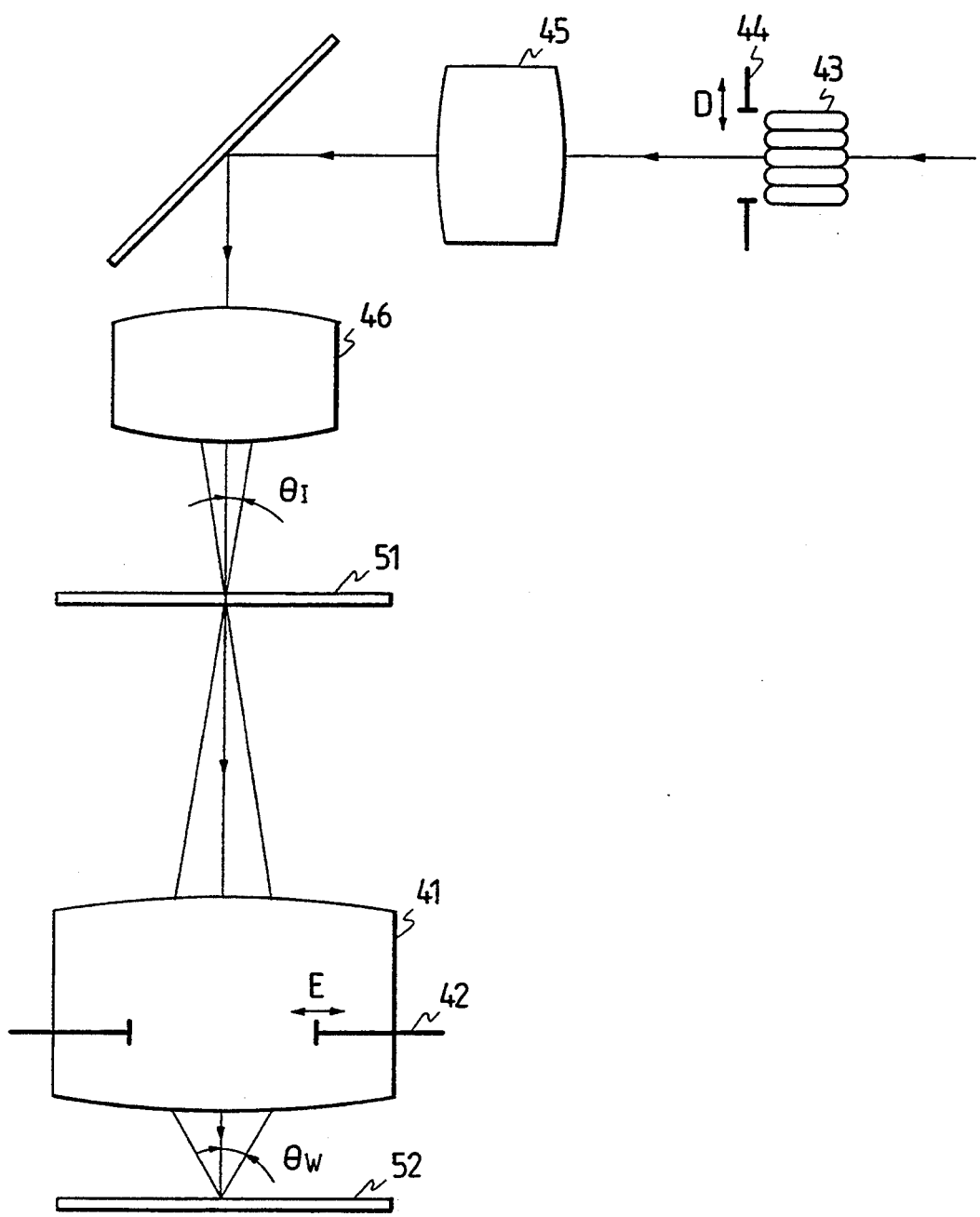
FIG. 8 is a view schematically showing the structure of a stepper according to the prior art.

An operator inputs an NAi and NAp through the key board 8 in accordance with the patterns to be exposed (step 14). Here, whether the combination of the inputted numbers (NAi and NAp) satisfies the relationship $NAp < NAi \times \alpha$ or not is determined (step 15). If affirmative, that is, if, in FIG. 7, the circle 11 which indicates the aperture of the first variable stop is larger than the circle 12 which indicates the aperture of the second variable stop, a warning message is output on a monitor screen or some other appropriate display device, at the same time a request being made for an input of another combination of the aperture numbers (NAi and NAp) (step 16). In accordance with this request, the operator inputs new data on the NAi and NAp (returning to the step 14). This loop of the data updating sequence will be repeated until the resultant determination in the step 15 becomes negative. If the resultant determination in the step 15 is negative, that is, if, in FIG. 7, the circle 11 which indicates the aperture of the first variable stop is smaller than (or equal to) the circle 12 which indicates the aperture of the second variable stop, each of the stops 44 and 42 is driven by the setting number value thus inputted to set the optical illumination system and optical projection system at the set up aperture numbers, respectively (step 17). In this state, the exposure operation will be executed in accordance with the given sequence.

Figure 3:
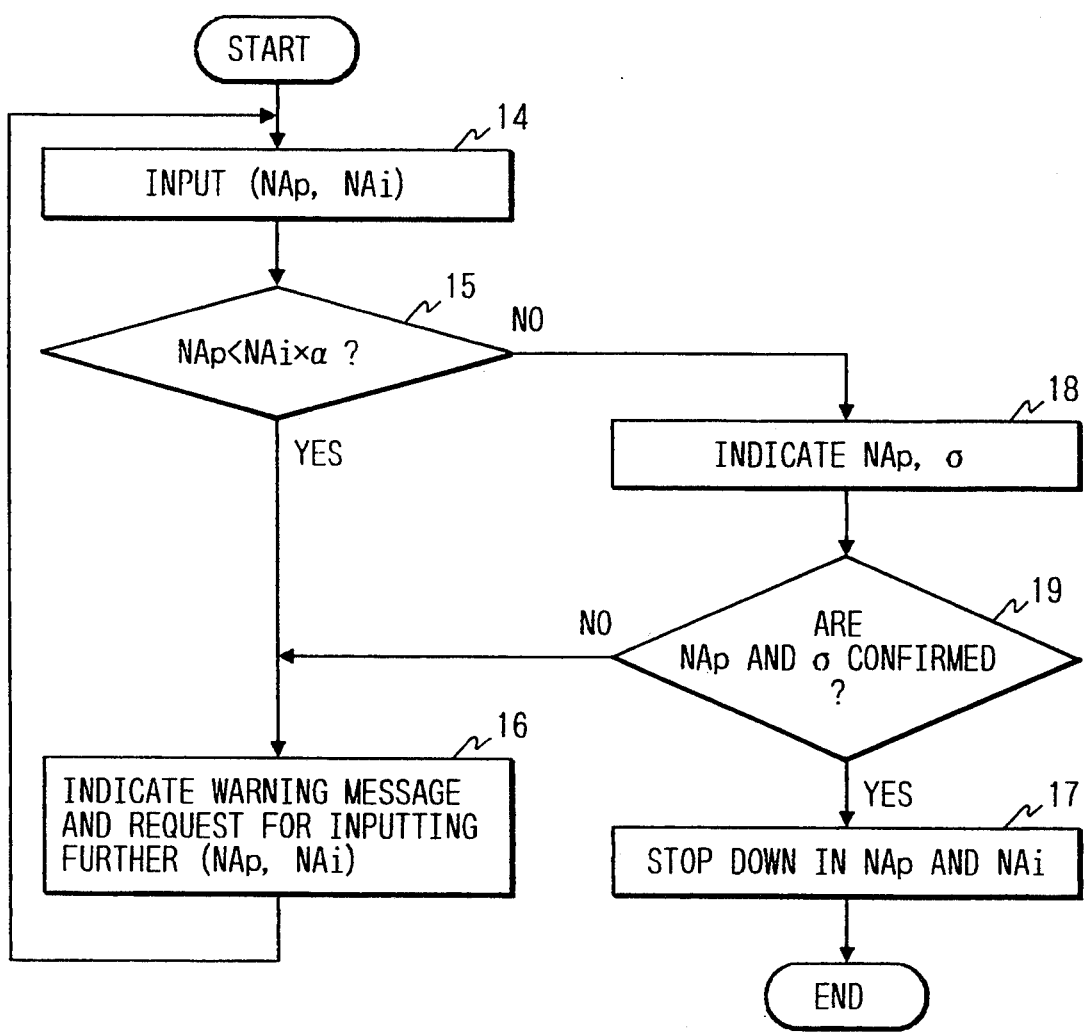
FIG. 3 is a flowchart showing another example of the aperture number setting up sequence for the stepper shown in FIG. 1.

FIG. 3 is a flowchart showing another example of the sequence to set up the aperture numbers.

This example is such that a step is inserted between the determination step 15 and the step 17 for driving the variable stops in the flowchart shown in FIG. 2 to indicate the NAp and 6 values thereby to allow the operator to confirm them. In other words, if the relationship $NAp < NAi \times \alpha$ in the foregoing step 15 is negative (where the exposure is possible), the values NAp and δ are displayed on a monitor screen before entering the exposure operation (step 18). The operator confirms whether the intended exposure operation will be executed or not in accordance with the displayed set up values NAp and δ (step 19). This is because it is desirable to perform the exposure with a greater margin for the value δ and the like even when the aperture set up values satisfy the relationship $NAp \geq NAi \times \alpha$ in terms of the reliability of exposure and others in some cases. If the resultant determination in the step 19 is negative, that is, the exposure is not desirable at the set up aperture numbers, the sequence will return to the step 16 to request an input of new set up values for the aperture numbers. When the operator inputs the new set up values (step 14), the sequence will thereafter be repeated in the same manner as described above. If, in the step 19, the resultant determination is affirmative, that is, the exposure can be executed at the set up aperture numbers, each of the stops 44 and 42 is driven to set the optical illumination system and optical projection system at the inputted aperture numbers, respectively (step 17). With the above, the sequence to set up the aperture numbers is terminated. Then, the exposure process will be executed at the aperture numbers thus defined.

As described above, the sequence to set up the aperture numbers is controlled by the CPU in accordance with the stored program so as not to allow the sequence to proceed to the exposure steps unless the relation is $NAp \geq NAi \times \alpha$. With this arrangement, when each of the aperture numbers is optimized independently by the respective variable stops for the optical illumination system and optical projection system, it is possible to prevent the exposure operation from being executed in such a state that the zero order diffraction light passing the variable stop on the optical illumination system side is irradiated over the blades of the variable stop on the optical projection system side.

Here, in the above-mentioned embodiment, the structure is arranged so that each of the NAi and NAp is inputted by the operator separately. Instead, however, it may be possible to arrange the structure so that a number of combinations (NAi and NAp) which provide the relationship $NAp \geq NAi \times \alpha$ are prepared in a form of menu in advance, and that the operator may select the optimal combination from the menu. Even with such an arrangement, there is no possibility that the exposure operation will be executed under a condition $NAp < NAi \times \alpha$.

Also, in the above-mentioned embodiment, the structure is arranged so that the NAi and NAp are inputted, but it may be possible to arrange the structure in order to input the stop amount for the first variable stop and the stop amount for the second variable stop. In such a case, the CPU 6 calculates the aperture number NAi for the optical illumination system and the aperture number NAp for the optical projection system, and then determines whether the calculated NAi and NAp are in a given relationship or not.

Figure 4:
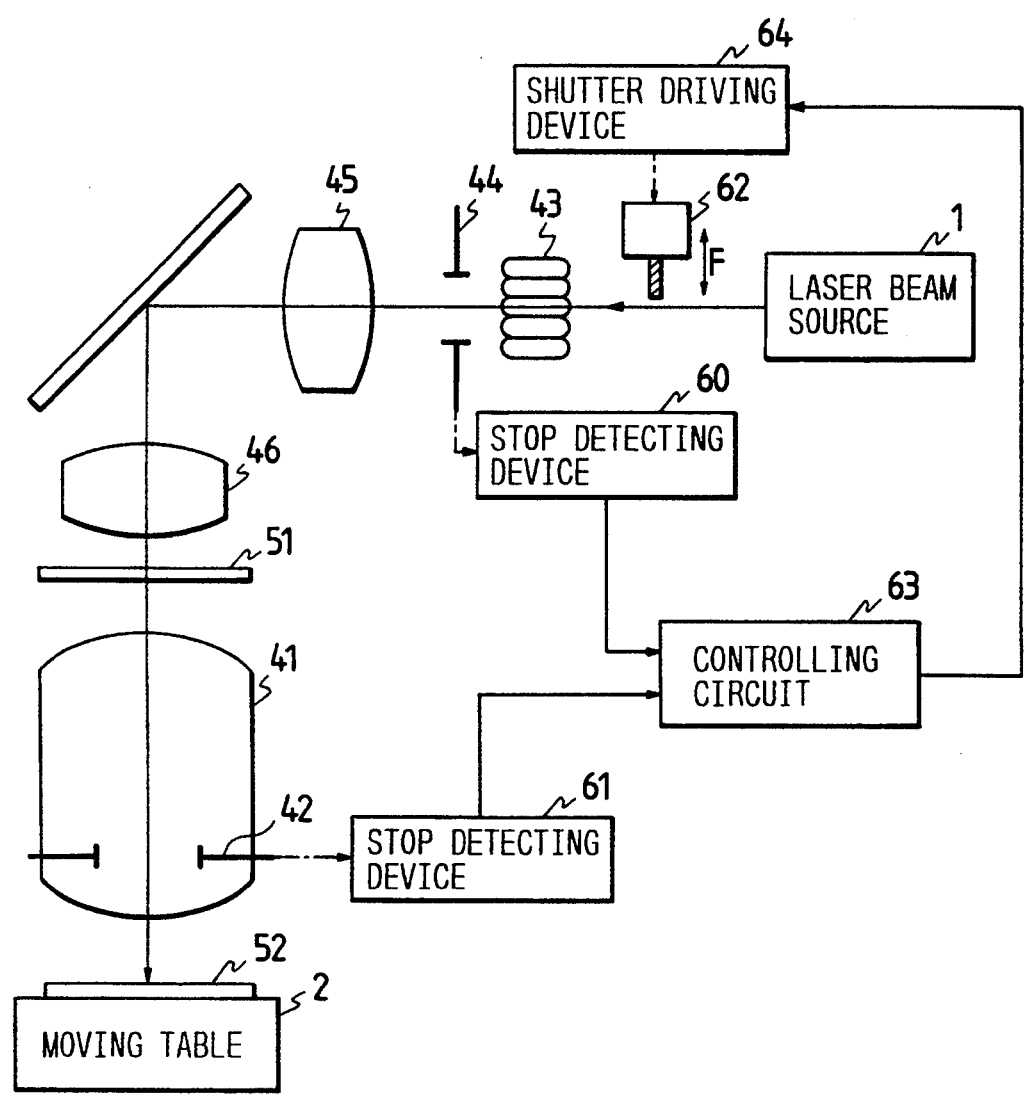
FIG. 4 is a view schematically showing the structure of a stepper according to a second embodiment of the present invention.

FIG. 4 is a view schematically showing the structure of a stepper according to a second embodiment of the present invention, in which the same reference numerals are given to the same or corresponding members as in the foregoing embodiment.

In the present embodiment, stop down detecting means 60 and 61 are provided for each of the first and second variable stops 44 and 42 to detect the sizes (stop amounts) of the apertures. Also, on the optical path of the laser beams from the laser beam source 1, a shutter 62 which operates as indicated by an arrow F is provided to open and close the optical path. The shutter 62 is connected to an electromagnetic valve, a motor or other appropriate driving device 64.

The stop down detecting means 60 and 61 to detect the stop amounts of the foregoing first and second variable stops 44 and 42 are connected to a control circuit 63. This control circuit 63 controls the shutter driving device 64 in accordance with the results of the detection by the respective stop down detecting means. In other words, the NAi and NAp are calculated in accordance with the detection signals from each of the stop down detecting means 60 and 61. Then, if the relationship between them is $NAp < NAi \times \alpha$ (or the relationship between the detection signals is equivalent to the $NAp < NAi \times \alpha$), the shutter 62 is closed through the shutter driving device 64. In this way, the exposure operation is essentially disabled. At this juncture, the control circuit 63 provides a warning, at the same time displaying a message to indicate that there is a requirement for changing the set up values of the aperture numbers for the stops 44 and 42 or a possibility of damage given to the stop blades (a trouble of a set up mechanism). The shutter 62 remains in a closed state until new aperture numbers are defined and the output relationship between the stop down detecting means 60 and 61 becomes equivalent to the relationship $NAp \geq NAi \times \alpha$.

Figure 5:
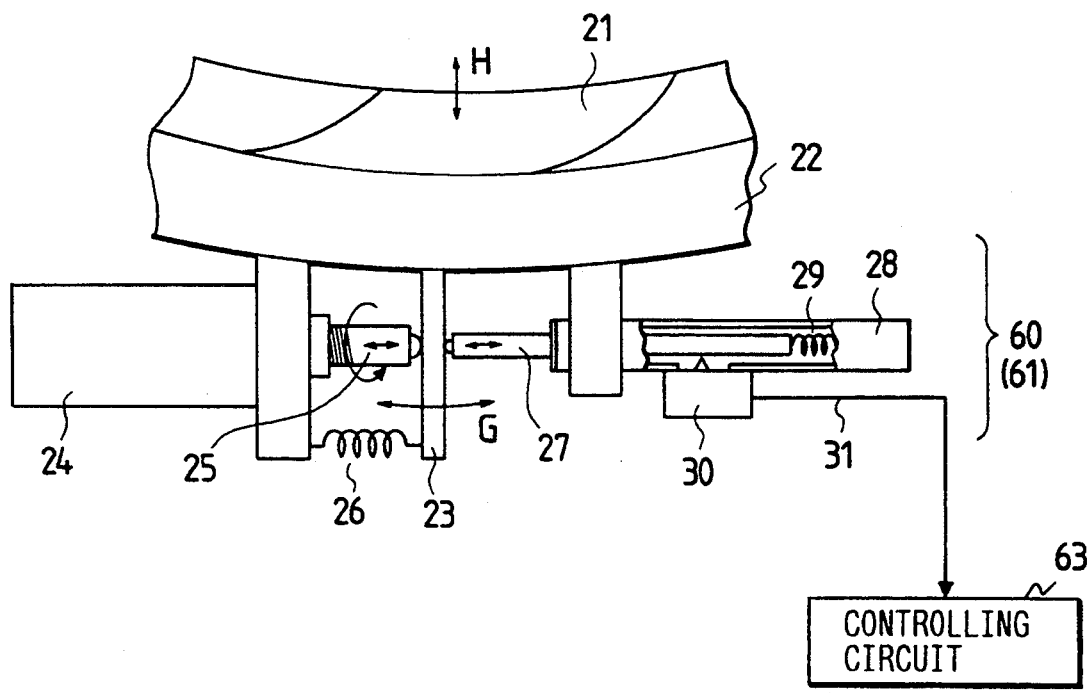
FIG. 5 is a view schematically illustrating the structure of an example of stop detecting means used for the embodiment shown in FIG. 4.

FIG. 5 is a view schematically showing an example of the above-mentioned detecting means 60 (61). The blades 21 constituting the foregoing variable stop 44 are installed on a ring type housing 22 to be capable of being opened and closed as indicated by an arrow H. The housing 22 is provided with a pin 23. The stop blades 21 are operated to be opened or closed as indicated by an arrow H by moving the pin 23 as indicated by an arrow G. This operation is performed by converting the rotational motion of the shaft 25 of a motor 24 to the linear motion required. The pin 23 is always biased by a spring 26 to the motor side, and as the shaft 25 is contracted, the pin 23 is shifted in the direction toward the motor accordingly; hence allowing the stop to be returned to its original state.

A piston 27 is provided to face the motor shaft 25 with respect to the pin 23. The piston 27 is slidably installed in a cylinder 28, and the leading end thereof is always pressed against the pin 23 by a spring 29. The position of this piston 27 is detected by a linear encoder 30. The output of the linear encoder 30 is transmitted to the foregoing control circuit 63 through signal wire 31.

The operation of the stop down detecting device structured as above is the same as the operation described earlier. In this respect, the structure of the stop down detecting device is not necessarily limited to the one shown in FIG. 5. It may be possible to arrange a structure so that a rotary encoder is directly provided for the motor 24 to obtain the position on the basis of the outputs therefrom, or some other mechanical detecting means linked to the pin 23, an electrical detecting means connected to a variable resistor, or some other appropriate detecting means.

Also, the control circuit 63 may be structured to control the laser drive in response to the output from the stop down detecting means 60 and 61 in order to suspend beam emission from the laser beam source 1 instead of the foregoing structure whereby to close the shutter 62.

FIG. 6 is a view schematically showing a stepper according to a third embodiment of the present invention, wherein an optical projection system of a reflective refraction reduction type is applied to the optical projection system. In this respect, the same reference numerals are given to the same or corresponding members in the first embodiment and any detailed description thereof will be omitted. Here, the optical projection system will be described in detail.

The beam passing the reticle 51 is further passed through a first lens group $G_1$ composed of a positive biconvex lens $L_{11}$ and a negative meniscus lens $L_{12}$ having its convex plane toward the reticle side, and reflected by a first concave reflection mirror $M_1$. Then, the beam enters a second lens group $G_2$ composed of a negative meniscus lens $L_{21}$ having its convex plane toward the first concave reflection mirror $M_1$ side and a positive lens $L_{22}$ with its plane having a stronger curvature toward the first concave reflection mirror $M_1$ side. Thus, a primary image $I_1$ which is further reduced by the second lens group $G_2$ is produced. The beam from the primary image $I_1$ is reflected by a plane reflection mirror $M_2$ to enter a second concave reflection mirror $M_3$. Here, a magnification slightly greater than the equal power is given by the reflection. Then, a reducing power is provided by a third lens group $G_3$ composed of a positive lens $L_{31}$ with a plane having a stronger curvature toward the second convex reflection mirror $M_3$, a meniscus lens $L_{32}$ having its convex plane toward the second concave reflection mirror $M_3$, and a positive lens $L_{33}$ with a plane having a stronger curvature toward the second concave reflection mirror $M_3$. Hence, a secondary image which is further reduced from the primary image $I_1$ is formed on the wafer 52. Here, a negative lens having a weak refraction power is arranged between the second concave reflection mirror $M_3$ and the third lens group $G_3$ as a fourth lens group $G_4$. A spherical aberration of a high order is desirably corrected. In the above-mentioned structure, the first lens group $G_1$, first concave reflection mirror $M_1$, and the second lens group $G_2$ constitute a first local optical system, and the second concave reflection mirror $M_3$, third lens group $G_3$, and fourth lens group $G_4$ constitute a second local optical system. The second lens group $G_2$ in the first local optical system is arranged only along one side of the optical axis $A_{X1}$ of the first local optical system in order to converge only the reflective light from the first concave reflective mirror $M_1$ without shielding the beams being emitted to the first concave reflection mirror $M_1$. Also, the plane reflection mirror $M_2$ for refracting the optical path is diagonally arranged at an angle of 45° to the optical axis $A_{X1}$ of the first local optical system in the vicinity of the third lens group $G_3$, and is structured to allow the optical axis $A_{X2}$ of the second local optical system to be orthogonal to the optical axis $A_{X1}$ of the first local optical system. Since this plane mirror $M_2$ is positioned in the vicinity of the primary image $I_1$, its size can be so small that it is possible to arrange it just by cutting off a part of the first positive lens $L_{31}$ of the third lens group $G_3$. Then, the fourth lens group $G_4$ in the second local optical system is arranged in such a manner that it does not shield the optical path of the first local optical system as a matter of course.

Now, in a case where the variable stop is provided for a reflection refractive reduction projection optical system such as above, its optical path is shielded. It is, therefore, impossible to arrange on the optical path any variable stop having a circular aperture. Consequently, as a second variable stop, a second stop member 42B having a semi-circular aperture is arranged in such a manner that it allows a first stop member 42A having a semi-circular aperture substantially on the pupil plane of the first local optical system to be positioned to control the right-hand side of the beams, and that the second stop member 42B having the semi-circular aperture is arranged in a position conjugative with the foregoing first stop member in the second local optical system to control the left-hand side of the beams. The first stop member 42A and second stop member 42B are operated by the driving devices 4A and 4B which are connected to them, respectively. The driving devices 4A and 4B are controlled by the CPU 6. The aperture number NAp of the optical projection system is set by controlling the first stop member 42A and second stop member 42B to position them appropriately.

In the above-mentioned third embodiment, the aperture numbers of the optical illumination system and optical projection system are set in the same way as in the first embodiment. In other words, the NAi and NAp are inputted by an operator through the key board 8 in accordance with the pattern to be exposed. The CPU 6 determines whether the inputted combination of (NAi and NAp) satisfies the relationship $NAp < NAi \times \alpha$ or not. If the relationship $NAp < NAi \times \alpha$ is satisfied, the CPU 6 requests the operator to input some other combination of (NAi and NAp) through a display such as a monitor screen. When it is determined that the relationship $NAp < NAi \times \alpha$ is not satisfied, the CPU controls the driving devices 3, 4A, and 4B to drive the first variable stop and second variable stop (first and second stop members 42A and 42B) in order to arrange the optical illumination system and optical projection system at the aperture numbers thus set up respectively.

As described above, in the present embodiment, too, it is possible to prevent any exposure operation from being operated in a state where the zero order diffraction light passing the variable stop of the optical illumination system is irradiated onto the blades of the variable stop on the optical projection system side. In this respect, it is needless to mention that the structure of the reflection refractive reduction projection system is not limited to the structure shown in FIG. 6.

As set forth above, in a stepper having the variable stops individually driven for each of the optical illumination system and optical projection system according to the present invention, its exposure operation is disabled when the relationship between the NAi and NAp set by each of the variable stops becomes $NAp < NAi \times \alpha$. As a result, there is no possibility that any direct exposure light is irradiated onto the blades of the variable stop arranged in the optical projection system; hence making it possible to prevent any harmful effects such as the lowered exposure performance due to flare or the like, the deterioration of the coating agent on the blade surface, and the adhesion of the coating agent to the optical components due to its peeling.

What is claimed is:

1. A method for projection exposure by irradiating illuminating rays through an optical illumination system onto a reticle on which a pattern to be transferred is formed and by imaging the projected image of said reticle on a transferring substrate through an optical projection system, including the following process of:
   determining, based on the aperture number of said optical illumination system and the aperture number of said optical projection system, whether all the zero order diffraction rays which pass said reticle, among the illuminating rays passing a first variable stop arranged in said optical illumination system, are able to pass the aperture of a second variable stop arranged in said optical projection system or not; and
   disabling the exposure operation when it is determined in said determining process that a part or all of said zero order diffraction rays cannot pass the aperture of said second variable stop.

2. A method for projection exposure according to claim 1, wherein
   said method further includes an aperture number inputting process to input an aperture number of said optical illumination system and an aperture number of said optical projection system, and
   whether all the zero order diffraction rays which pass said reticle, among the illuminating rays passing a first variable stop arranged in said optical illumination system, are able to pass the aperture of a second variable stop arranged in said optical projection system or not is determined by the aperture number of said optical illumination system which is inputted in said aperture number inputting process and the aperture number of said optical projection system which is inputted in said aperture number inputting process.

3. A method for projection exposure according to claim 2, wherein
said method further includes a process to set a stop down amount for said first variable stop and a stop down amount for said second variable stop on the basis of the aperture numbers inputted in said inputting process when it is determined in said determining process that all of said zero order diffraction rays are able to pass said second variable stop.

4. A method for projection exposure according to claim 1, wherein
said method further includes a detection process to detect the stop down amount of said first variable stop and the stop down amount of said second variable stop; and
a calculating process to calculate an aperture number for said optical illumination system and an aperture number for said optical system of projection on the basis of the stop down amounts detected in said detecting process, and
whether all the zero order diffraction rays which pass said reticle, among the illuminating rays passing a first variable stop arranged in said optical illumination system, are able to pass the aperture of a second variable stop arranged in said optical projection system or not is determined by the aperture number of said optical illumination system which is calculated in said calculating process and the aperture number of said optical projection system which is calculated in said calculating process.

5. A method for projection exposure according to claim 1, wherein
said method further includes:
a stop down amount inputting process to input a stop down amount for said first variable stop and a stop down amount for said second variable stop; and
a calculating process to calculate an aperture number for said optical illumination system and an aperture number for said optical projection system on the basis of the stop down amounts inputted in said stop down amount inputting process, and
whether all the zero order diffraction rays which pass said reticle, among the illuminating rays passing a first variable stop arranged in said optical illumination system, are able to pass the aperture of a second variable stop arranged in said optical projection system or not is determined by the aperture number of said optical illumination system which is calculated in said calculating process and the aperture number of said optical projection system which is calculated in said calculating process.

6. A method for projection exposure according to claim 1, wherein
said disabling process causes the exposure operation to be disabled in a case of $NAp < NAi \times \alpha$ where the aperture number of said optical illumination system is NAi, the aperture number of said optical projection system is NAp, and further, the magnification of the projection exposure is $\alpha$.

7. A method for projection exposure according to claim 1, wherein
said disabling process causes a shutter arranged on the optical path of said illumination rays to be closed in a case of $NAp < NAi \times \alpha$ where the aperture number of said optical illumination system is NAi, the aperture number of said optical projection system is NAp, and further, the magnification of the projection exposure is $\alpha$.

8. A method for projection exposure according to claim 1, wherein
said process further includes an aperture number modification process to modify the aperture number of said optical illumination system and the aperture number of said optical projection system when it is determined in said determining process that a part or all of said zero order diffraction rays cannot pass the aperture of said second variable stop.

9. A method for projection exposure according to claim 1, wherein
said optical projection system is a reflection refractive reduction projection system.

10. A method for projection exposure according to claim 9, wherein the reflection refractive reduction projection system includes the following:
a first local optical system provided with a lens group having a positive refractive power, and a first concave reflection mirror to form the primary reduction image of said reticle;
a second local optical system provided with a second concave reflection mirror and a lens group having a positive refractive power to reimage said primary reduction image by a further reduction thereof;
a lens group arranged in the vicinity of said first reduction image to converge the reflective rays from said first concave reflection mirror; and
a reflection mirror arranged in the optical path between said first concave reflection mirror and said second concave reflection mirror to refract said optical path, and
said first local optical system, said second local optical system, said lens group and said reflection mirror are arranged in that order from said reticle.

11. A method for projection exposure according to claim 1, wherein
said optical projection system is a reflection refractive reduction optical system which includes a first local optical system provided with a lens group having a positive refractive power, and a first concave reflection mirror in that order from said reticle side to form the primary reduction image of said reticle; a second local optical system provided with a second concave reflection mirror and a lens group having a positive refractive power to reimage said primary reduction image by a further reduction thereof; a lens group arranged in the vicinity of said first reduction image to converge the reflective rays from said first concave reflection mirror; and a reflection mirror arranged in the optical path between said first concave reflection mirror and said second concave reflection mirror to refract said optical path, and
said first local optical system, said second local optical system, said lens group and said reflection mirror are arranged in that order from said reticle, and
said second variable stop includes,
a first stop member arranged substantially on the pupil plane of said first local optical system to control a half of the beams of those passing said reticle;
a second stop member arranged in a position conjugative with said first stop member to control the remaining half of the beams of those passing said reticle.

12. A stepper to irradiate illuminating rays through an optical illumination system onto a reticle on which a pattern to be transferred is formed and to image the projected image of said reticle on a transferring substrate through an optical projection system, including the following:
- a first variable stop means provided in said optical illumination system to make the aperture number of said optical illumination system variable;
- a second variable stop means provided in said optical projection system to make the aperture number of said optical projection system variable; and
- control means to determine whether all the zero order diffraction rays which pass said reticle, among the illuminating rays passing a first variable stop arranged in said optical illumination system, are able to pass the aperture of a second variable stop arranged in said optical projection system or not by the aperture number of said optical illumination system and the aperture number of said optical projection system, and to disable the exposure operation when it is determined in said determining process that a part or all of said zero order diffraction rays cannot pass the aperture of said second variable stop.

13. A stepper according to claim 12, wherein
said stepper further includes driving means to drive said first variable stop means and said second variable stop means; and
control means to control the driving of said driving means in accordance with a given program, at the same time executing the exposure operation, and
the program for said control means is formed to make a request to modify the aperture number of said optical illumination system and the aperture number of said optical projection system when it is determined in said determining process that a part or all of said zero order diffraction rays cannot pass the aperture of said second variable stop.

* * * * *